United States Patent [19]
Gerber et al.

[11] Patent Number: 6,035,113
[45] Date of Patent: Mar. 7, 2000

[54] ELECTRON BEAM PROXIMITY CORRECTION METHOD FOR HIERARCHICAL DESIGN DATA

[75] Inventors: Porter Dean Gerber; Samuel Jonas Wind, both of White Plains, N.Y.

[73] Assignee: International Business Machines Corporation, Armonk, N.Y.

[21] Appl. No.: 09/002,841

[22] Filed: Jan. 5, 1998

[51] Int. Cl.[7] .................................................. G06F 17/50
[52] U.S. Cl. .................................... 395/500.2; 395/500.22
[58] Field of Search ............................. 395/500.2, 500.22

[56] References Cited

U.S. PATENT DOCUMENTS

| | | |
|---|---|---|
| 5,008,553 | 4/1991 | Abe . |
| 5,051,598 | 9/1991 | Ashton et al. . |
| 5,149,975 | 9/1992 | Yoda et al. . |
| 5,182,718 | 1/1993 | Harafuji et al. . |
| 5,278,419 | 1/1994 | Takahashi et al. . |
| 5,278,421 | 1/1994 | Yoda et al. . |
| 5,294,800 | 3/1994 | Chung et al. ..................... 250/492.22 |
| 5,305,225 | 4/1994 | Yamaguchi et al. . |
| 5,847,959 | 12/1998 | Veneklasen et al. ............... 364/468.28 |
| 5,876,902 | 3/1999 | Veneklasen et al. .................... 430/296 |

*Primary Examiner*—Kevin J. Teska
*Assistant Examiner*—Hugh Jones
*Attorney, Agent, or Firm*—Scully, Scott, Murphy & Presser; Casey P. August

[57] ABSTRACT

A method for formulating an exposure dose for an electron beam on a resist film for a pattern of geometric shapes which compensates for electron scattering effects utilizing hierarchial design data which is preserved to as great as an extent as possible in the computation of the exposure dose. The exposure dose is corrected for both the forward scatter and backscatter effects of the electron beam in which the design data is modified for interactions of shapes which are affected only over the forward scatter range. In another version of the method, a multiple Gaussian approximation is used where the short term Gaussian terms are treated as the forward scatter terms and the long term Gaussian terms are treated as the back scatter terms.

9 Claims, 2 Drawing Sheets

ELECTRON BEAM PROXIMITY CORRECTION METHOD FOR HIERARCHICAL DESIGN DATA

BACKGROUND OF THE INVENTION

1. Field of the Invention

The present invention generally relates to the technology of electron beam lithography, and more specifically to a method for proximity effect correction in electron beam lithography systems.

2. Description of the Prior Art

In recent years, various electron beam lithography systems have been employed to write fine patterns on samples such as semiconductor wafers. The samples are typically covered by a thin film called a resist. The resist properties are modified by exposure to an electron beam according to a desired pattern. The patterned resist film is used as a stencil for subsequent processing. Electrons emitted towards the sample collide with nuclei, etc., of the sample and scatter. This is called backward scattering. A phenomenon called forward scattering also occurs. Forward scattering is the electron scattering that occurs in the resist prior to entry into the substrate. Forward scattering also represents the finite beam spread in real electron beam systems. This scattering of electrons may result in distortions to the desired pattern. This is called the proximity effect. The proximity effect may change the shape and dimensions of the part of the sample under the resist from those required.

Various correction techniques to reduce the proximity effect have been developed. The most accurate techniques compute the effects of electron scattering on design patterns on a shape-to-shape basis, varying the electron dose applied to an individual shape, such that all shapes in a pattern receive the same total absorbed electron energy (i.e., the exposure). This is known as an exposure equalization technique.

An increase in the number of devices and elements on a chip increases the chip density and complexity. The chip density and complexity is further increased as features become smaller in size. This translates into greater demands on the computing resources required for performing proximity correction, as more shape-to-shape interactions must be computed. In addition, new electron beam lithography tools are now available which operate at high incident electron energies (approximately 100 Kev), increasing the range of back scattered electrons, resulting in an increase in the number of shape-to-shape interactions which must be computed.

Common chip design tools employ a powerful data compaction technique, known as nesting or design hierarchy, whereby a shape or a collection of shapes (i.e., cell) may be replicated any number of times in different parts of the design pattern without designing new shapes each time. This is done by simply referring to the original shape (or cell) for each subsequent placement, or instance, of that shape (or cell).

In order to perform accurate proximity correction, it is necessary to know precisely the effects of all the shapes within the scattering range of a given shape. For a 100 KeV electron beam, this range may extend as far as 50 $\mu$m on a silicon substrate. Thus, the calculation of shape-to-shape interactions must be done for a large number of shapes. In general, this requires the loss of data compaction given by efficient use of design hierarchy, since the scattering effects influencing a given shape in a design cell may vary from one instance of the shape (or cell) to another.

In U.S. Pat. No. 5,051,598 issued Sep. 24, 1991, to Ashton et al., entitled, METHOD FOR CORRECTING PROXIMITY EFFECTS IN ELECTRON BEAM LITHOGRAPHY, incorporated herein by reference, a technique is described which provides a significant improvement in proximity correction efficiency, referred to as the dose-on-grid technique. This technique is based on the splitting of the proximity function into two separate portions: a local portion, describing the effects due primarily to forward scattering of the incident electron beam; and a remote portion, describing the effects due to long range back scatter of electrons.

The back scatter portion is generally a more slowly varying function of distance from the incident electron beam than is the local portion, and it may be accurately represented on a grid. According to the technique disclosed in Ashton et al., a fractional density matrix is generated. This matrix represents the pattern shape density on the grid, without reference to the individual shapes. A proximity matrix is also computed, which represents the back scatter (remote) portion of the proximity function under a set of given electron beam exposure conditions (i.e., electron energy, substrate composition). When the density matrix is convolved with the proximity matrix, the resulting dose matrix, represents the back scatter corrected dose field on the grid. Individual shape doses are computed by interpolating the dose field from nearby grid points onto the shape.

Despite the significant computational advantages offered by the dose-on-grid technique, the data compaction of the original design hierarchy is lost, since, in generating the fractional density matrix, the positions of all shapes in the pattern must be known. The result is twofold: (a) data storage volumes may increase dramatically as the fractional density matrix is generated by replacing individual shapes, and (b) in the calculation of the fractional density matrix, the same calculation may be repeated on the same shapes numerous times, resulting in inefficiency.

For the foregoing reasons, there is a need for a method for efficiently computing a dose correction in electron beam lithography systems whereby the pattern design hierarchy is retained to as great an extent as possible during the process of proximity correction.

SUMMARY OF THE INVENTION

An object of the present invention is to provide a method for proximity effect correction in electron beam lithography, suitable for high beam voltages and/or for very dense patterns.

Another object of the present invention is to provide a method for proximity effect correction in electron beam lithography by dose correction.

A further objective of the present invention is to provide a method of dose correction for reducing proximity effects in high voltage electron beam lithography wherein cells are imposed on a chip pattern and a correction process is applied based on fractional shape density matrices of patterns.

Yet another objective of the present invention is to provide a proximity effect correction technique for electron beam lithography including back scattering corrections and forward scattering corrections.

Still another objective of the present invention is to provide a grid based dose correction technique for electron beam lithography which takes into account a proximity effect correction and a fractional density correction while retaining as much of the design hierarchy used in its calculation as possible, thereby improving the computational efficiency of the calculation without sacrificing its accuracy.

Another objective of the present invention is to provide a proximity correction technique which compensates for forward scattering without significant loss of the design hierarchy.

The present invention is directed to a method that satisfies these and other objectives. The method comprises, a compact design hierarchy which is used to generate the fractional density matrix. This may be done by traversing the hierarchy tree of the design data and computing the fractional density matrix for the entire pattern coverage of basic cells (pattern cells containing actual shapes). As all instances of a basic cell contain identical pattern coverage, the fractional density matrix may be computed very efficiently.

A point of novelty, among others, of the present invention is that shape-to-shape interactions are explicitly calculated only for the forward scatter correction, which is extremely short ranged. For the vast majority of designs encountered in electron beam lithography, the number of cells with different environments over the forward scatter range will be much smaller than the number of cells with different environments over the back scatter range. The back scatter correction is calculated by a dose field technique, which involves the convolution of the proximity function for back scatter with the pattern density matrix. Therefore, calculation of the density matrix may be done without flattening the pattern data.

At the point where the back scatter correction dose is applied to the individual shapes, different instances of the same shape which require different back scatter correction must be distinguished. However, since the correction has already been done, this step can be deferred until the time at which the pattern is written by the lithography tool. This way, it is not necessary to store very large flat files.

In another variation of the present invention, a local density matrix may be calculated for basic cells. This may be generated directly from the shapes in the cell, or alternatively, forward scatter correction may be performed on the individual shapes within the cell, yielding a weighted density matrix. This matrix is replicated over the entire pattern area, based on the instantiation (or placement) of the cell in the pattern. This is done for all cells in the pattern, resulting in a fractional density matrix for the entire pattern.

The back scatter correction is computed as described by Ashton et al., which is incorporated herein by reference, by convolving the fractional density matrix with the proximity matrix to create a dose matrix. The back scatter corrections are then assigned to the individual shapes in the pattern. Here too, the correction can take advantage of the design data hierarchy, since it is necessary to apply different dose assignments only to those instances of a given shape or cell for which the dose field varies. The dose required to expose individual shapes may be stored as part of the individual shape information, in which case, variant shapes (or cells) must be generated for those shapes (or cells) which have variations in the individual shape dose assignments. Alternatively, for greater data compaction, the dose information may be stored separately, with variant doses for shapes (or cells) having variations in the individual shape dose assignments, but the original design hierarchy may be restored, if desired. This requires that a reliable technique be provided to reassign the correct doses to the appropriate shapes at the time of electron beam exposure.

Forward scatter correction may be done on a shape-to-shape basis within individual pattern cells, with variants created for instances of shapes or cells having shapes which interact with shapes in closely neighboring cells, i.e., within the forward scatter range. These shapes or cells may either be retained as variants, or may have the dose information stored separately. For maximum efficiency, the assignment of doses to individual shapes for both forward scatter and back scatter correction may be done in the electron beam pattern generation hardware.

In another version of the present invention, a multiple Gaussian approximation to the electron energy distribution is used for improved accuracy. In this version the short range Gaussian terms are treated as the forward scatter term, and the long range Gaussian terms are treated as the back scatter term.

Additional objects and advantages of the present invention will be set forth in the description which follows, and in part will be obvious from the description, or may be learned by practice of the present invention. The objects and advantages of the present invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the present invention and, together with the general description given above and the detailed description of the preferred embodiments given below, serve to explain the principles of the present invention in which.

DETAILED DESCRIPTION OF THE PREFERRED EMBODIMENT OF THE INVENTION

Figure 1:
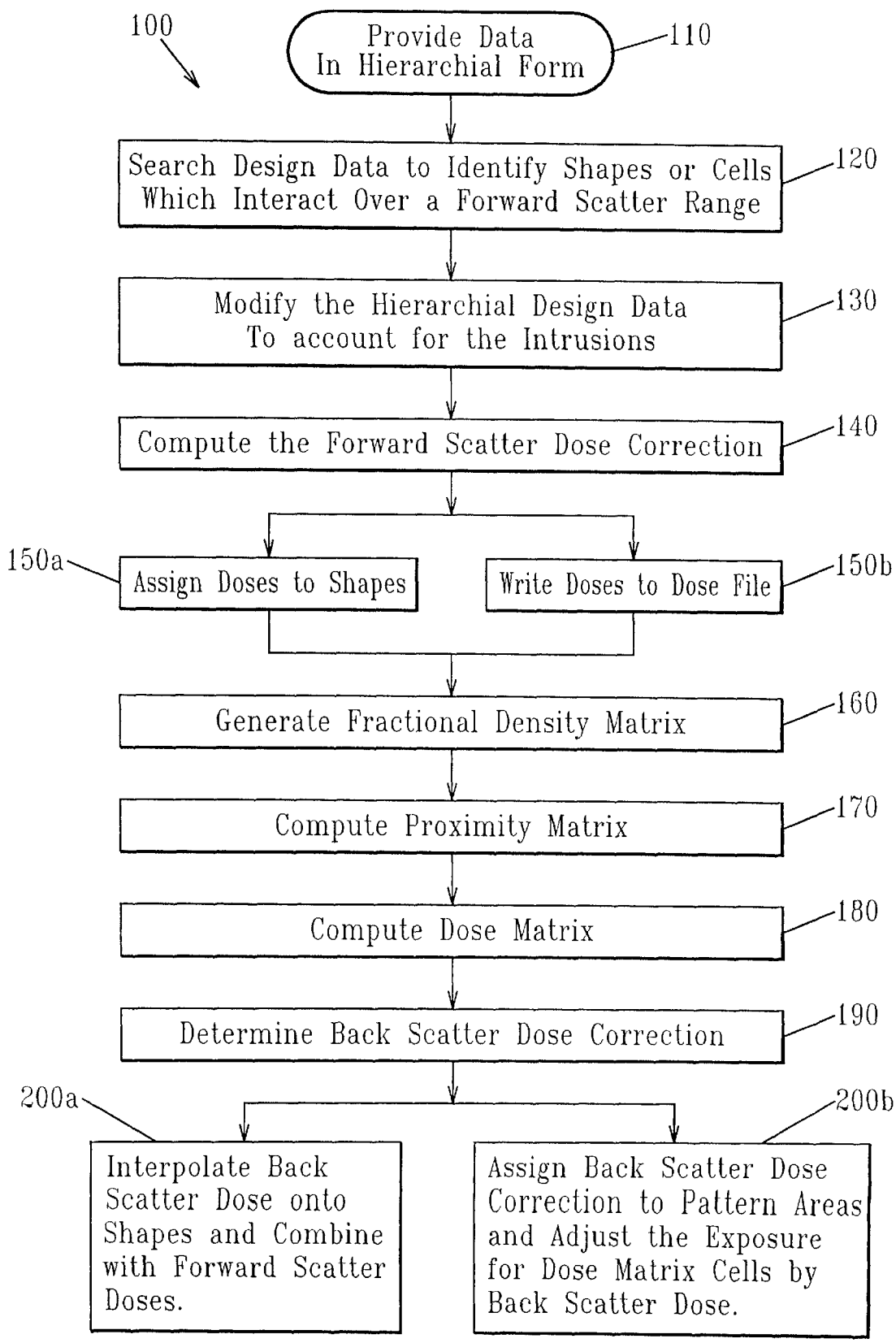
FIG. 1 is a flow diagram of the present invention.

Referring now in detail to FIG. 1, in which a method of the present invention is illustrated, and generally referred to by reference numeral 100. The method formulates an exposure dose for an electron beam on a resist film for a pattern of geometric shapes compensating for electron scattering effects, in which the design data is provided in step 110 in hierarchial form. The design data consists of a library of cell types specifying the geometric shapes and their respective cells.

The hierarchy is then searched in step 120 to identify shapes from different cells which interact over the forward scatter range, aα. The interacting shapes are referred to as intrusions. The searching step 120 determines if intrusions exist in the hierarchial pattern layout.

The design hierarchy is then modified in step 130 by either moving the intruding shapes into the cells with which they interact, or by creating variant cells in which the presence of the intruding shapes is recognized. For typical designs, this will be required for only a very small percentage of the total shapes.

The step of modifying 130 the hierarchial design data typically comprises shapes processing which includes union of shapes, removing overlaps between shapes, expanding or shrinking shapes, fracturing shapes (cutting large shapes into smaller shapes for optimized processing), and/or applying sleeves to large shapes. This sort of shapes processing is standard in typical data preparation for electron beam lithography.

Figure 2:
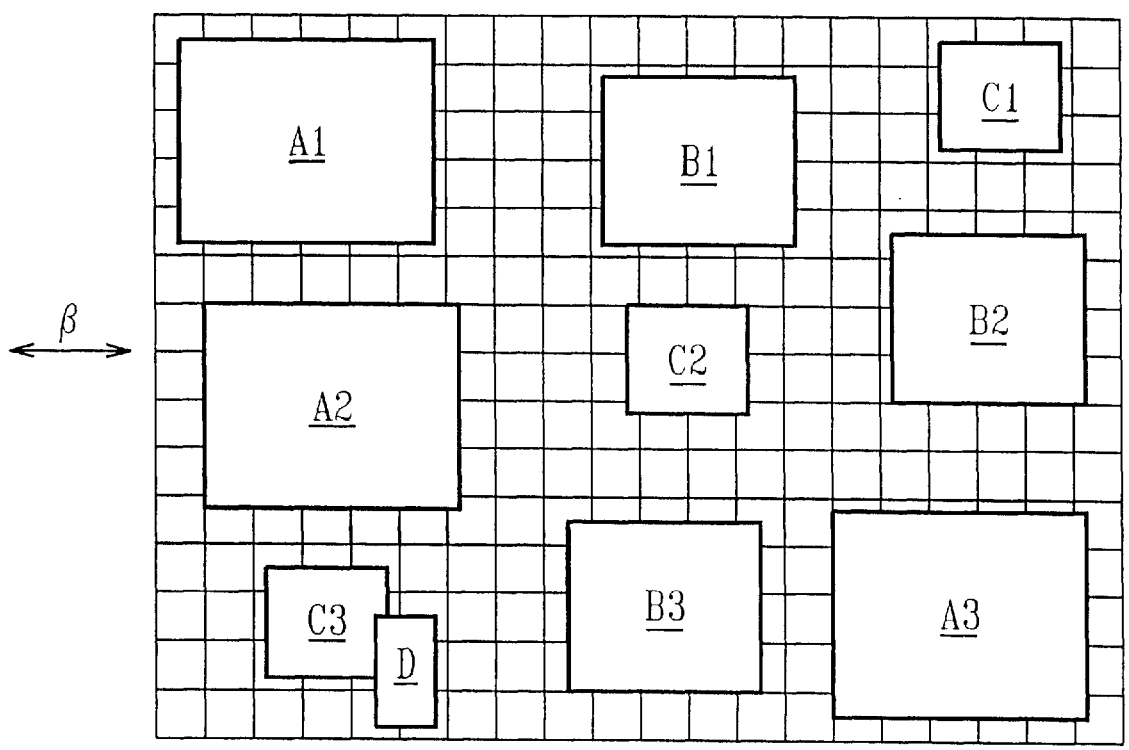
FIG. 2 is a typical hierarchial pattern layout in which the method of the present invention is employed to determine a proximity correction.

An example of modifying the hierarchy design data in step 130 is shown in FIG. 2 in which a typical hierarchial pattern layout is illustrated. Cells A, B, C, and D are all different from one another. A1, A2, and A3 are instances of cell A; B1, B2, and B3 are instances of cell B; C1, C2, and C3 are instances of cell C.

The placement of cells A, B, and C is such that they are within the back scatter interaction range, cβ, of one another, but not within the forward scatter interaction range, aα, except for cell C3, which interacts with cell D over the forward scatter range.

The shapes in cells A1, A2, and A3 may be corrected for forward scatter as native cell A; the shapes in cells B1, B2, and B3 may be corrected for forward scatter as native cell B; the shapes in cells C1 and C2 may be corrected for forward scatter as native cell C. However, cell C3 must either be combined with cell D, or be treated as a distinct variant from native cell C, which may be referred to as native cell C'.

Thus, the hierarchy is retained for cells A1–A3, B1–B3, and C1–C2. There is only a slight increase in the pattern data for variant cell C'.

Referring back to FIG. 1, after the hierarchy is modified in step 130, proximity correction for forward scattering is computed in step 140. The forward scatter dose correction is computed on a shape-to-shape basis. As pointed out by Ashton et al, which is incorporated herein by reference, any desired or convenient existing algorithm may be used.

The critical difference in the present invention is not in the correction algorithms, but rather in how the shapes are grouped for modification in step 130. Since the forward scatter range is extremely short (of the order of the minimum feature size), for the purpose of computing the correction for any individual shape, interactions with other shapes must be considered only over a range ~aα, which is the range of influence of forward scattered electrons.

Here, α is the Gaussian parameter used to characterize the forward scatter portion of the electron energy density distribution in a resist film, and is a multiplicative factor, typically ~2–3. For most shapes in a typical pattern design, there will be a small number of interacting shapes within this range. Moreover, the overwhelming majority of these interacting shapes will be in the same cell in the design hierarchy. Shapes from nearby cells which fall within the forward scatter range are called intrusions. Minor modifications to the hierarchy may be made in step 130 to account for these intruding shapes, such as moving the shapes to another cell in the hierarchy, or creating a variant cell to include the intruding shapes. The forward scatter dose correction may then be computed in step 140 for the shapes in each of the cells plus the variants. For most pattern designs which employ hierarchial compaction, this will result in significant savings relative to flattening all the cells and calculating the correction for each individual shape instance.

After computing the proximity correction for forward scatter in step 140, the forward scatter dose is stored by either assigning it to the shapes as an attribute to be retained in the hierarchical design in step 150a or, alternatively, writing it to a separate forward scatter dose file in step 150b, which may be combined with the shapes at a later point.

The fractional density matrix (F) is then generated in step 160 as described by Ashton et al., which is incorporated herein by reference, by superimposing a mesh of square cells onto the pattern area. The size of each cell is β/b (Ashton et al. uses β/a to describe the matrix cell size). However, the difference between the present invention and Ashton et al. is that in the present invention the fractional density matrix may be generated in step 160 directly from the hierarchial pattern library, without flattening the data.

The procedure used in generating the fractional density matrix in step 160 is done by traversing the hierarchy tree of the pattern library, and computing the fractional shape coverage for each hierarchial cell in the design (i.e., the fraction of the total area of the cell covered by shapes). For cells which comprise nested cells in the hierarchy, the density of the nested cells may be projected directly onto the parent cell. The fractional shape coverage for the prime cell (i.e., the highest level parent cell) is the projection of the shape coverage of all underlying cells in the hierarchy tree. A mesh of square cells is then superimposed onto the area of the prime cell. The area of each cell is β/b, as described by Ashton et al., which is incorporated herein by its reference. The fractional shape density for each cell in the matrix is then computed. Optionally, the fractional density may be weighted by the forward scatter corrected doses applied to the shapes in each cell.

The proximity matrix (P) is then computed in step 170 precisely as is described in Ashton et al., which is incorporated herein by its reference. The proximity matrix gives the interaction of cells based on their relative geometrical configuration and the proximity function, which, in the present invention, is only the back scatter term. The proximity matrix is computed in step 170 using one of a number of linear combination proximity correction algorithms known in the art.

The dose matrix (D) is then computed, 180, by convolving the fractional density matrix (F) and the proximity matrix (P) to come up with a dose for each cell.

A back scatter correction is then determined in step 190 from the results of the previous three steps (160, 170, and 180). It is determined in step 190 for each shape by averaging the dose matrix (or dose field) over the shape by a polynomial or suitable interpolation function. Alternatively, the back scatter correction may be determined in step 190 on an area weighted average basis.

Lastly a final corrected dose is computed by either interpolating the back scatter doses onto the shapes and combining the results with the forward scatter doses in step 200a, or alternatively by assigning the back scatter dose correction to the pattern areas and adjusting the exposure for the dose matrix cells by the back scatter dose in step 200b.

From the foregoing, it becomes readily apparent to one skilled in the art that the novel Electron Beam Proximity Correction Method of the present invention offers advantages over the prior art electron beam proximity correction methods. Due to the inventive retention of the pattern design hierarchy during the process of proximity correction, the advantages offered by the inventive method resides in:

(a) increased computational efficiency in that multiple instances of shapes with identical forward scatter environments but different back scatter environments can be corrected only once for forward scatter;

(b) reduced data storage requirements relative to flat file handling; and (c) optimized accuracy achieved by employing different algorithms for forward scatter correction and back scatter corrections.

While there has been shown and described what is considered to be preferred embodiments of the invention, it will, of course, be understood that various modifications and changes in form or detail could readily be made without departing from the spirit of the invention. It is therefore intended that the invention be not limited to the exact forms described and illustrated, but should be constructed to cover all modifications that may fall within the scope of the appended claims.

Having thus described our invention, what we claim as new, and desire to secure by Letters Patent is:

1. A method for formulating an exposure dose for an electron beam on a resist film for a pattern of geometric shapes which compensates for electron scattering effects, the method comprising the steps of:

provinding design data in hierarchial form, the design data consisting of a library of a plurality of cell types specifying the geometric shapes and their location within the respective cell, searching the design data to identify shapes or cells which interact over a forward scatter range, the interacting shapes or cells being intrusions, modifying the hierarchial design data to account for the intrusions, computing a forward scatter dose correction on a shape-to-shape basis for the modified hierarchial design data, storing the data indicative of said forward scatter dose compensation, generating a fractional density matrix from the hierarchial library data, where the matrix grid size is a function of a back scatter range, computing a proximity matrix based on the back scatter range, computing a dose matrix by convolving the fractional density matrix and the proximity matrix, determining the back scatter dose correction based on the fractional density matrix, proximity matrix and dose matrix, and computing the final corrected dose for each shape in the pattern, said final corrected dose utilized by an electron beam pattern generation tool for patterning geometric shapes in a resist film with reduced electron scattering effects.

2. The method as claimed in claim 1, wherein the modifying step comprises one of removing overlaps between shapes, union of shapes, expanding shapes, shrinking shapes, fracturing shapes, and applying sleeves to shapes.

3. The method as claimed in claim 1, wherein the step of storing the forward scatter dose correction comprises assigning the forward scatter dose correction to the shapes as attributes to be retained in the hierarchial design data.

4. The method as claimed in claim 1, wherein the step of storing the forward scatter dose correction comprises writing the forward scatter dose correction to a forward scatter dose file to be combined with the shapes.

5. The method as claimed in claim 1, wherein the step of generating a fractional density matrix comprises the sub-steps:

traversing the hierarchy design data for the pattern of shapes, computing a fractional shape coverage for each cell in the design data, projecting the density of nested cells in the hierarchy design data onto a parent cell, the highest level parent cell being a prime cell, computing an overall fractional shape coverage by projecting the shape coverage of all underlying cells in the hierarchial design data, superimposing a mesh of square cells onto the area of the prime cell, and computing the fractional shape density for each cell in the matrix.

6. The method as claimed in claim 5, further comprising the step of weighting the fractional density by the forward scatter corrected doses applied to the shapes in each cell.

7. The method as claimed in claim 1, wherein the step of computing the final corrected dose for each shape in the pattern comprises:

interpolating the back scatter correction onto the shapes, and combining the interpolated back scatter correction with the forward scatter dose.

8. The method as claimed in claim 1, wherein the step of computing the final corrected dose for each shape in the pattern comprises:

assigning the back scatter dose correction to the pattern areas, and adjusting the exposure for the dose matrix cells by the back scatter dose correction.

9. The method as claimed in claim 1, wherein the forward scatter dose corrections are treated as short range Gaussian terms and the backscatter dose corrections are treated as long range Gaussian terms.

* * * * *